(12) United States Patent
Vining (10) Patent No.: US 7,265,690 B2
(45) Date of Patent: Sep. 4, 2007

(54) SIMPLIFIED DATA RECOVERY FROM HIGH SPEED ENCODED DATA

(75) Inventor: Suzanne Mary Vining, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 394 days.

(21) Appl. No.: 10/671,164

(22) Filed: Sep. 25, 2003

(65) Prior Publication Data

US 2005/0071713 A1 Mar. 31, 2005

(51) Int. Cl.
*H03M 5/06* (2006.01)
(52) U.S. Cl. .......................... 341/68; 341/69; 375/326; 375/360
(58) Field of Classification Search ............ 341/68–69; 360/41
See application file for complete search history.

(56) References Cited

U.S. PATENT DOCUMENTS

| | | | |
|---|---|---|---|
| 5,239,561 A | 8/1993 | Wong et al. | |
| 5,329,559 A | 7/1994 | Wong et al. | |
| 5,602,873 A * | 2/1997 | Balasubramanian et al. | 375/242 |
| 5,671,258 A * | 9/1997 | Burns et al. | 375/359 |
| 5,974,097 A * | 10/1999 | Julyan et al. | 375/340 |
| 6,052,248 A | 4/2000 | Reed et al. | |
| 6,275,084 B1 * | 8/2001 | McAdams | 327/239 |
| 6,529,148 B1 * | 3/2003 | Maddux | 341/100 |
| 6,545,507 B1 | 4/2003 | Goller | |
| 6,556,640 B1 * | 4/2003 | Baba | 375/376 |
| 6,584,163 B1 * | 6/2003 | Myers et al. | 375/360 |
| 6,760,389 B1 * | 7/2004 | Mukherjee et al. | 375/326 |
| 2003/0091137 A1 * | 5/2003 | Vallet et al. | 375/360 |

* cited by examiner

*Primary Examiner*—Khai M. Nguyen
(74) *Attorney, Agent, or Firm*—J. Dennis Moore; W. James Brady, III; Frederick J. Telecky, Jr.

(57) ABSTRACT

The present invention facilitates data recovery without requiring selection of a sample phase. The data is recovered by sampling a received signal to obtain a number of samples at a number of phases over a given time period referred to as a bit time. The samples are analyzed to determine if a transition has occurred in one or more consecutive phases. Such a transition is also referred to as a data toggle. Generally, one or more toggles in a single bit time indicate one data value (e.g., a zero) whereas no transitions indicate another data value (e.g., a one).

26 Claims, 11 Drawing Sheets

SIMPLIFIED DATA RECOVERY FROM HIGH SPEED ENCODED DATA

FIELD OF THE INVENTION

The present invention relates generally to the high speed encoded data, and more particularly, to systems and methods to infer data values of high speed encoded data.

BACKGROUND OF THE INVENTION

With the recent increased speed of computers and the need for high performance peripherals, the use of high speed serial data communications applications in integrated circuits built to physically interface to any given bus has increased correspondingly.

USB (Universal Serial Bus) 1.1 has been the de facto external connectivity standard between computers and their peripherals in serial communications up to 12 Mbps (Million bits per second). As the need for faster communications and higher performance peripherals has grown, computer and peripheral manufacturers have responded with a new higher speed standard: USB 2.0.

USB 2.0 increases the device data throughput up to 480 Mbps, 40 times faster than USB 1.1 devices while maintaining or improving on other USB 1.1 specifications such as the Microsoft Plug and Play feature, and numerous other technical specifications, some of which will be discussed in relation to the present invention. USB 2.0 even challenges FireWire (IEEE 1394) currently at 400 Mbps, as the serial interface of the future. Three speed modes are available under the new USB 2.0 standard: high-speed (480 Mbps), full-speed (12 Mbps), and low-speed (1.5 Mbps).

Figure 1:
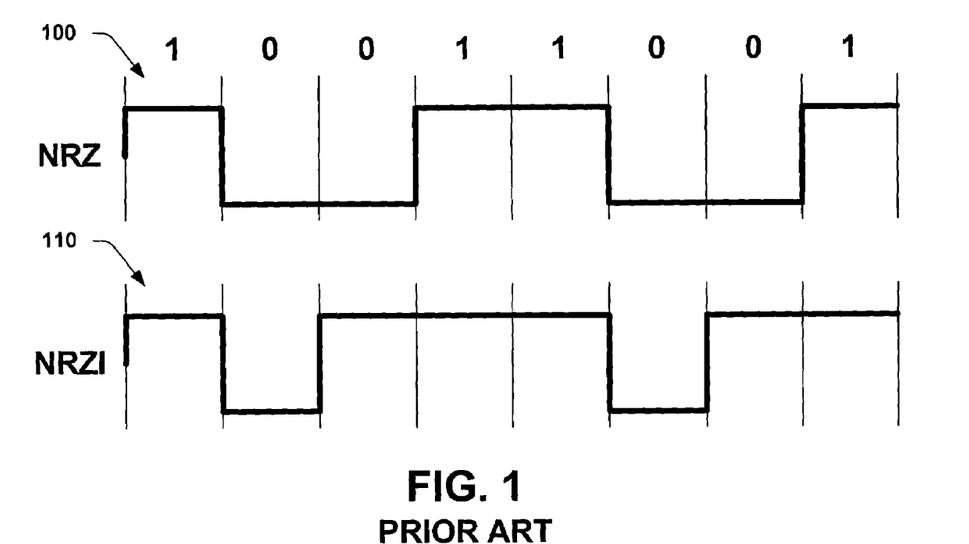
FIG. 1 is a diagram illustrating an example of NRZ and NRZI data encoding.

Conventionally, an incoming serial data stream may be NRZI (Non-Return-to-Zero Inverted) encoded and bit stuffed. NRZI is a data transmission method in which the polarity of the bit is reversed whenever a 0 bit is encountered, and a static voltage level is transmitted whenever a 1 bit is encountered as illustrated in FIG. 1, and designated at reference numeral 110. NRZI thus uses the presence or absence of a transition to signify a bit (indicating a logical 0 by inverting the state). Combined with bit-stuffing, where an extra 0 bit is inserted after every six consecutive 1 bits, this data encoding causes a guaranteed transition every 7 bit times when a data payload would be all 1 bits. Every transition gives the CDR circuit phase information that it uses to align its recovered clock to the phase of the incoming data. The less time between transitions, the less phase error which is to be expected caused by frequency offset. Other techniques used are, for example, 8b–10b coding similar to 1394, PCI express, and Ethernet.

The structure of the data stream follows a specific communications protocol, which defines the rules for sending a block of data (each known as a Protocol Data Unit (PDU)) (e.g., 150 of FIG. 2) from one node in a network to another node. The exchanged PDUs comprises three parts: a sync sequence 160, a packet payload (also known as a Service Data Unit (SDU)) 170, and an End of Packet (EOP) 180. The protocol does not define or constrain the data carried in the payload portion 170 of the data block. The protocol does, however, specify the format of the sync sequence.

Packet switching refers to protocols in which a longer message (the data) exceeding a network-defined maximum length is divided into short message packets before they are transmitted. Each packet, with an associated header with information for routing the packet from origination to destination, is then transmitted individually and can even follow different routes to its destination. Once all the packets forming a message arrive at the destination, they are recompiled into the original message. Most modern Wide Area Network (WAN) protocols, including the successful TCP/IP protocol, as well as X.25, and Frame Relay, are based on packet-switching technologies.

A fundamental difference between packet communication and conventional, continuous-type communication is that the data is formed into packets as described above. When there is no data to be sent, the bus is put into an idle state that shows no change in voltage levels. Continuous-type protocols would fill the idle time within a frame with well-known "idle" patterns which are used to occupy the link when there is no data to be communicated. A packet network equipment discards the "idle" patterns between packets and processes the entire packet as one piece of data. The equipment examines the packet header information (PCI) and then either removes the header (in an end system) or forwards the packet to another system. If the out-going link is not available, then the packet is placed in a queue until the link becomes free. A packet network is formed by links which connect packet network equipment.

Figure 2:
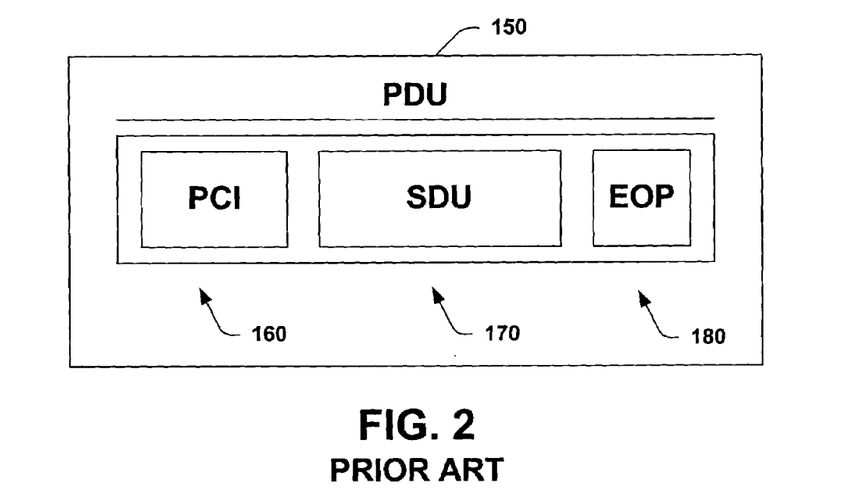
FIG. 2 is a diagram illustrating an exemplary structure of a data stream.

In the packet switching used in USB 2.0 at 480 Mbps, one portion of the packet header 160 will contain at least 12 sync bits indicated by an alternating pattern, intended to allow the sending and receiving clocks time to synchronize. The packet payload 170 will contain up to 1024 bits, while the end-of-packet 180 contains 8 bits.

The incoming data stream may be at different frequency than the receiving system. Each side can vary from an ideal frequency within a +/− delta range as limited by a ppm tolerance value defined in a respective industry standard. Often, the source and receive frequencies are different. Regardless of the relative source and destination frequencies, the incoming data stream shows all jitter components of an electrical transmission over a bandwidth limited media (e.g., data dependant cycle to cycle jitter).

A linear clock and data recovery (CDR) circuit attempts to recover the original transmitting clock and data. A conventional CDR circuit attempts to recover the clock and data by utilizing a phase detector (PD) or alternatively a phase-frequency detector (PFD), and source a charge pump followed by a VCO of an analog PLL. A received data stream is sampled at a number of phases. Generally, a sample phase and clock phase are selected for each bit time according to the sampled phases. The sampled data is then analyzed and extracted with the selected clock and sample phases to recover the transmitted data. However, complex logic is required to determine appropriate sample and clock phases as well as obtaining the data.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates serial data communication by utilizing a simplified mechanism to extract data from an incoming/received data stream without first obtaining or selecting a sample phase. The data is obtained without employing complex logic circuits and muxes by utilizing properties of the NRZI encoding scheme. The present invention identifies transitions or a lack thereof in a bit time to recover data.

The data is recovered by sampling a received signal to obtain a number of samples at a number of phases over a given time period referred to as a bit time. The samples are analyzed to determine if a transition has occurred in one or more consecutive phases. Such a transition is also referred to as a data toggle. Generally, one or more toggles in a single bit time indicate one data value (e.g., a zero) whereas no transitions indicate another data value (e.g., a one).

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

Figure 3:
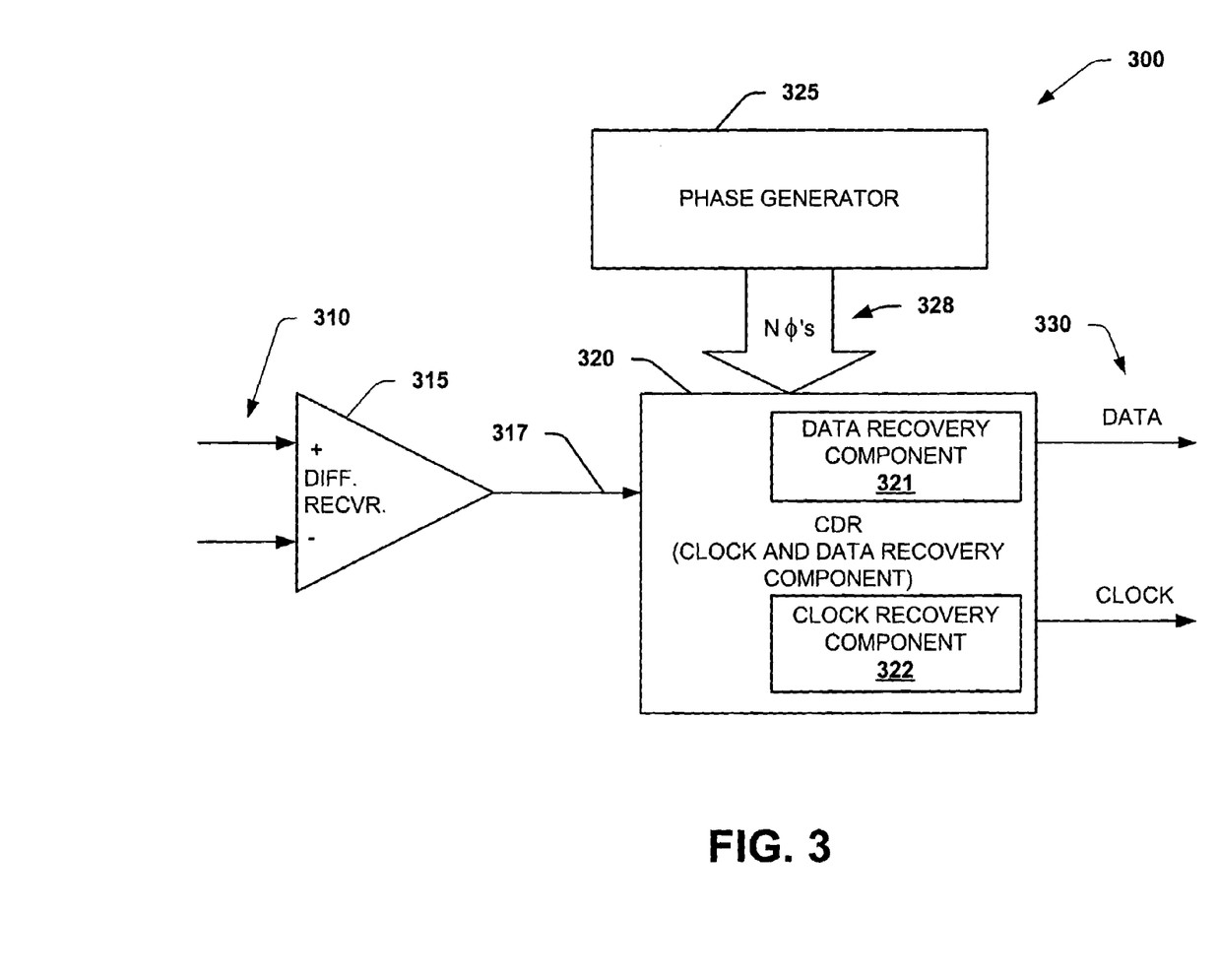
FIG. 3 is a diagram illustrating an exemplary clock data recovery system in accordance with an aspect of the present invention.

FIG. 3 illustrates an exemplary CDR system 300, in which several aspects of the current invention may be accomplished. A received serial data stream 310 enters a differential receiver (e.g., or transceiver) 315 and outputs a single ended received serial data stream 317 into a CDR circuit 320. A phase generator 325 generates a local clock signal running at approximately the same frequency as a transmitter clock utilized to initially generate the received serial data stream 310. The phase generator 325 produces N phases 328 of the clock signal which are supplied to the CDR circuit 320.

The number of phases (N) generated and supplied by the phase generator 325 is implementation dependent and depends upon a number of factors (e.g., jitter, bit time/period, and the like). The N phases are successively offset by (1/N)×bit time so as to provide evenly spaced phases throughout the time period/bit time. As an example, assume 8 phases were sufficient for USB 2.0, which has a bit time or time period of 2.08333 ns (1/480 MHz). As a result, the 8 phases could be successively offset by (1/8)×2.08333 ns. The N clock phases 328 of the example, together with the single ended data stream 317 are input to the CDR circuit 320 which is operable to obtain a recovered clock and recovered data 330. A data recovery component 321 detects data stream transition(s) and obtains recovered data from the data stream transition(s). A clock recovery component 322 is operable to recover one or more clocks associated with the recovered data. Unlike conventional CDR circuits, the CDR circuit 320 does not require sample phase detection and/or selection in order to obtain the recovered data. A recovered clock phase can be used by the data recovery component 321 to sample the toggle history over a past bit time.

Figure 4:
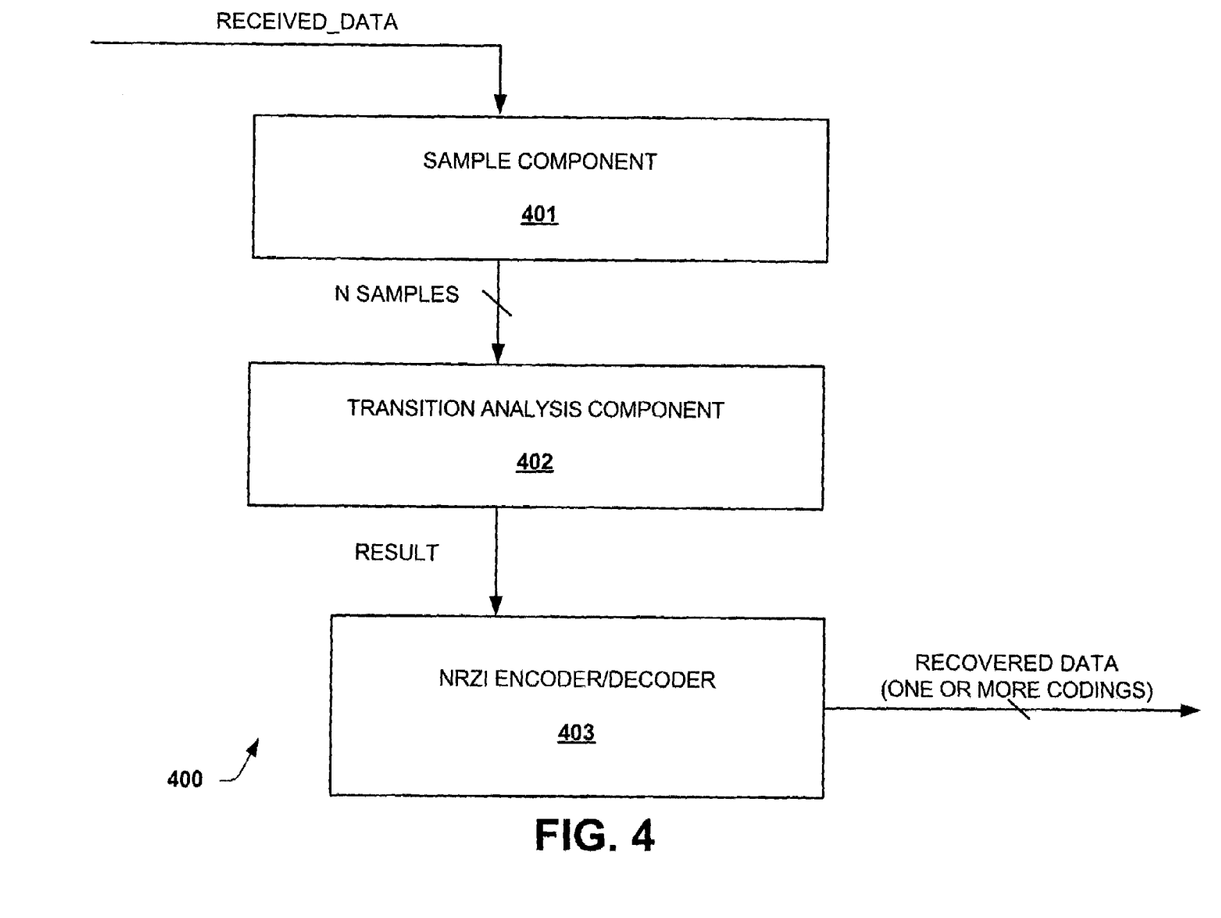
FIG. 4 is a block diagram illustrating a data recovery component in accordance with an aspect of the present invention.

FIG. 4 is a block diagram illustrating a data recovery component 400 (similar to component 321 in FIG. 3) in accordance with an aspect of the present invention. The data recovery component 400 is described at a high level to illustrate certain aspects of the invention. A more detailed discussion of an exemplary implementation is provided infra.

The data recovery component 400 operates on a received serial data stream to obtain a recovered serial data stream. The received serial data stream can include relatively high jitter and other non-desirable components and an unknown clock (although the frequency is known) whereas the recovered serial data stream is substantially jitter free with a known clock phase. The data recovery component 400 is operable to obtain the recovered serial data stream without selecting and/or identifying a specific data/sample phase. Conventional CDR and/or data recovery components select a specific data phase and a clock phase in order to select a specific sample, which is then employed to recover the serial data. The data recovery component 400 instead employs the encoding of NRZI to obtain data by noting that occurrence of a transition during a bit time indicates a logical 0 whereas the non-occurrence of a transition during a bit time indicates a logical 1. It is appreciated that variations of the NRZI encoding can be employed, such as where the occurrence of a transition indicates a logical 1 and the non-occurrence thereof indicates a logical 0, and be in accordance with the present invention.

The data recovery component 400 comprises a sample component 401, a transition analysis component 402, and an NRZI encoder/decoder component 403. The sample component 401 is operable to receive a serial data stream that has been encoded with NRZI encoding and generate N samples of the serial data stream. The sample component 401 obtains the N samples, substantially evenly spaced, through N phases of a bit time/time period. Flip-flops and/or other sampling devices can be employed to physically sample the data. A separate clock/phase generation component can be employed to generate the N phases. Successive sets of N samples are generated for subsequent bit times by the sampling component 401.

The transition analysis component 402 receives the N samples from the sample component 401 and determines whether a transition has occurred during the associated bit time. A result indicating whether a transition has or has not occurred is generated according to the determination. The transition analysis component 402 analyzes consecutive samples to identify a low to high or high to low transition. Upon identifying one or more transitions, the transition analysis component 402 generates a result indicating that a transition has occurred (e.g., high). Otherwise, the transition analysis component 402 generates a result indicating that a transition has not occurred (e.g., low). The result can also be referred to as decoded data. Note that the result is also the complement of the original data that was encoded where a transition indicates a zero and a non-transition indicates a one. A result is generated for each bit time.

The NRZI encoder/decoder 403 receives the result from the transition analysis component 402 and generates one or more codings of recovered data. Any number of suitable codings can be generated. As one example, a complement of the result yields a decoded serial data stream substantially identical to original data. As another example, an exclusive or (XOR) of a current result with a previous result yields NRZI encoded data.

Figure 5A:
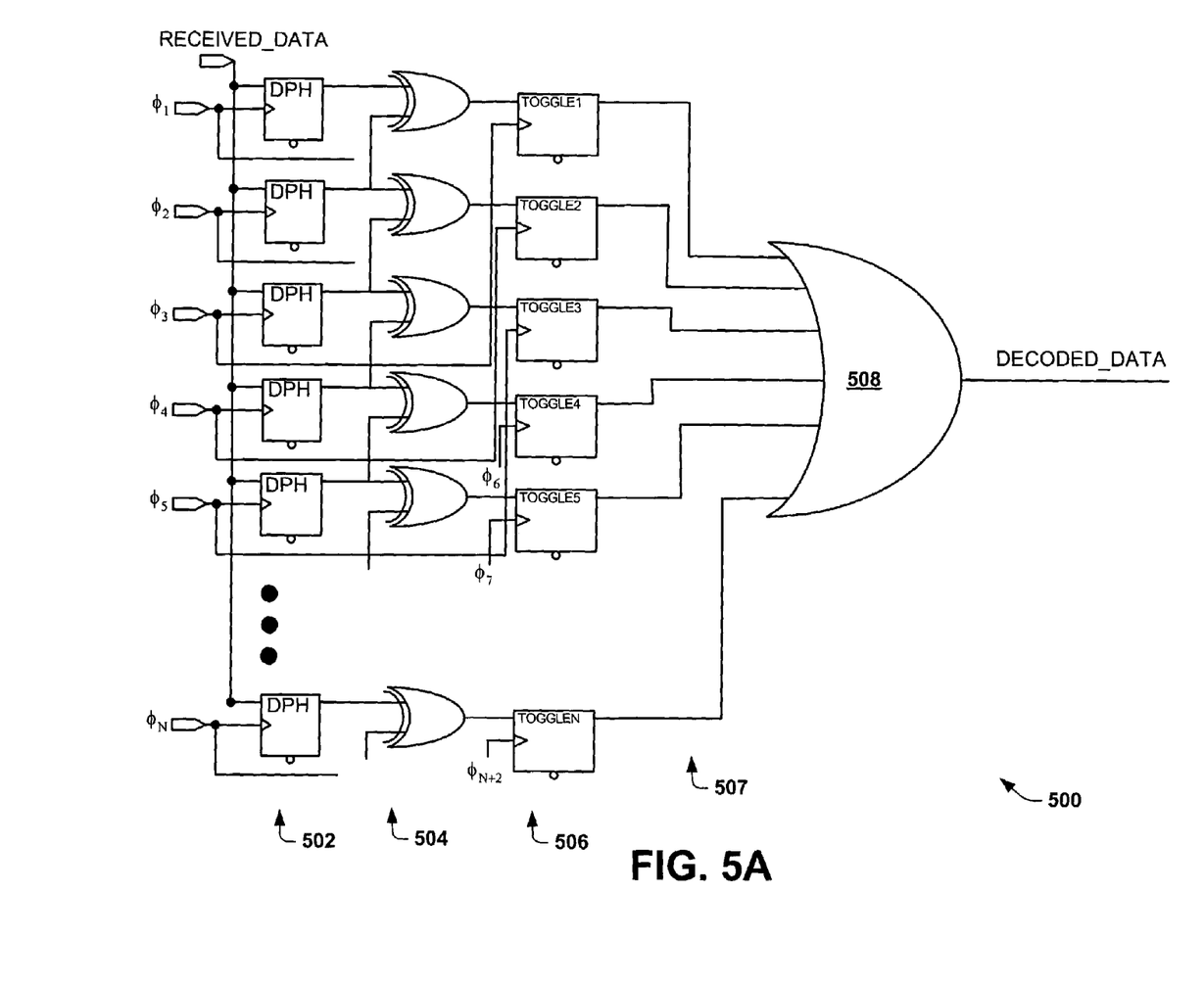
FIG. 5A is a schematic diagram illustrating a portion of a data recovery component in accordance with an aspect of the present invention.
Figure 5B:
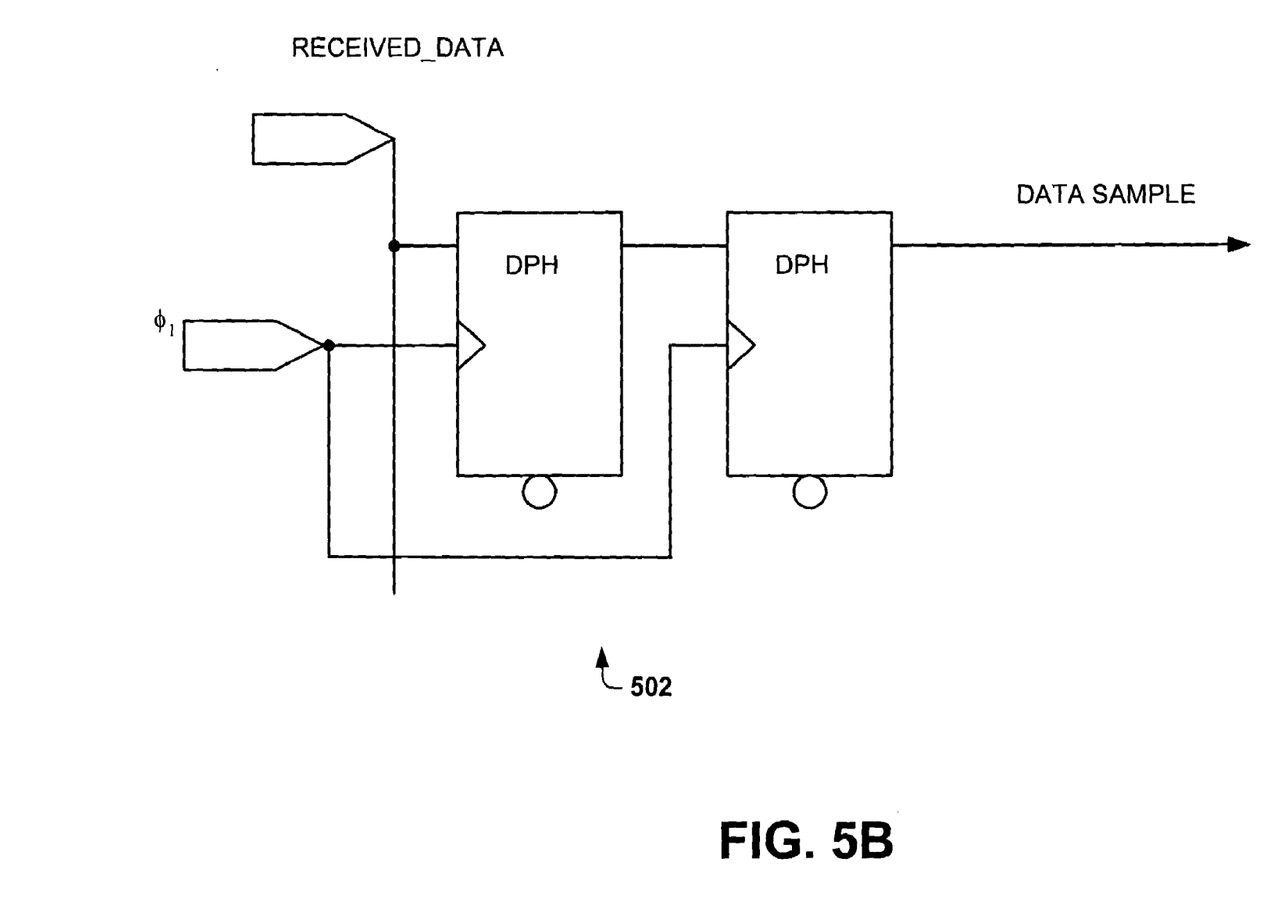
FIG. 5B is a schematic diagram illustrating a variation of sample components in accordance with an aspect of the present invention.
Figure 5C:
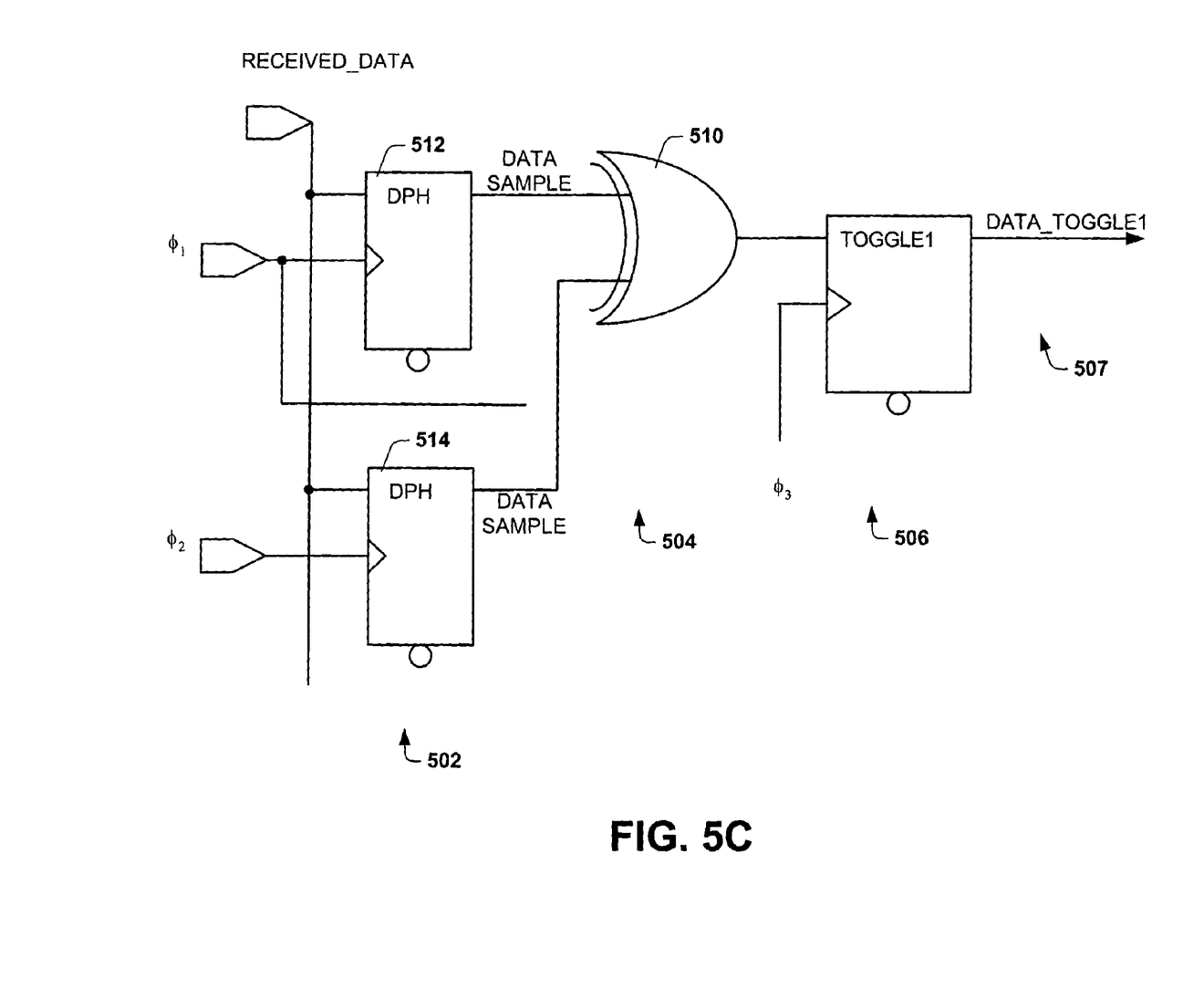
FIG. 5C is a close up view of a portion of the data recovery component in accordance with an aspect of the present invention.

FIGS. 5A, 5B, and 5C are diagrams illustrating an exemplary data recovery component 500 (similar to the data recovery component 321 of FIG. 3) in accordance with an aspect of the present invention. The data recovery component 500 operates on a received serial data stream to obtain a recovered serial data stream. The received serial data stream can include relatively high jitter and other non-desirable components and an unknown clock (although the frequency is known) whereas the recovered serial data stream is substantially jitter free with a known clock phase. The data recovery component 500 is operable to obtain the recovered serial data stream without selecting and/or identifying a specific data/sample phase. Conventional CDR and/or data recovery components select a specific data phase and a clock phase in order to select a specific sample, which is then employed to recover the serial data. The data recovery component 500 instead utilizes the encoding of NRZI to obtain data by noting that occurrence of a transition during a bit time indicates a logical 0 whereas the non-occurrence of a transition during a bit time indicates a logical 1. It is appreciated that variations of the NRZI encoding can be employed, such as where the occurrence of a transition indicates a logical 1 and the non-occurrence thereof indicates a logical 0, and be in accordance with the present invention.

FIG. 5A is a schematic diagram of a first portion of the data recovery component 500 in accordance with an aspect of the present invention. A number of sample components or registers 502, such as D type flip flops, receive a serial data stream that is encoded via NRZI encoding. The sample components 502 are clocked with different phases (N phases) so as to obtain samples at N phases of a clock corresponding to a bit time. The sample components 502 generate a corresponding number of data samples based upon a latching of the received data at a timing dictated by the N phases. Although the sample components 502 are depicted as a single stage/column of flip flops, multiple stages can be employed to mitigate metastability.

Turning briefly to FIG. 5B, another diagram illustrating a variation of the sample components 502 is provided, wherein dual D type flip flops are employed for each phase to obtain a data sample in accordance with an aspect of the present invention. The data sample is delayed a cycle before being supplied by the sample components 502, however metastability can be reduced.

Returning to FIG. 5A, a number of XOR components 504 receive the data samples from the sample components 502 (e.g., a first sample component and a next sample component associated with the next phase within the bit time) and generate XOR products of consecutive data samples. As a result, the XOR products indicate whether or not a high-low or low-high transition has occurred for associated consecutive data samples. Thus, the XOR components operate as transition detectors. It is appreciated that other suitable components could be employed in place of the XOR components to detect transitions and still be in accordance with the present invention.

Still referring to FIG. 5A, a number of data toggle components or registers 506, such as D type flip flops, receive the XOR products and generate an output related to the occurrence of a transition between two associated data samples. The data toggle components 506 are triggered using a clock phase that is one phase greater than one of the associated sample components. For example, a data toggle component associated with a data sample obtained at phase 1 and a data sample obtained at phase 2 is clocked using phase 3. The data toggle components 506 output a corresponding number of data toggles 507, which generally indicate a transition if high and no transition if low. An OR circuit 508, for example, receives the data toggles 507 and outputs decoded data as a function of the received data toggles 507. Generally, the decoded data is a one or high if one or more of the data toggles are high or one, and low if the data toggles are low or zero.

Turning now to FIG. 5C, a close up view of a portion of the data recovery component 500 in accordance with an aspect of the present invention is presented. This view is presented to further illustrate operation and configuration of the data recovery component 500.

A first sample component 512 of the number of sample components 502 receives the received data and is clocked on $\Phi_1$. Similarly, a second sample component 514 of the number of sample components receives the received data and is clocked on $\Phi_2$. Data samples of the first sample component 512 and the second sample component 514 are provided to an XOR component 510. The XOR component generates a "1" or "high" value on a transition occurring between $\Phi_1$ and $\Phi_2$. In other words, the XOR component generates a "1" or "high" value on the data sample of the first sample component being "1" and the data sample of the second sample component being "0" or on the data sample of the first sample component being "0" and the data sample of the second sample component being "1". Otherwise, if no transition in the data occurs between $\Phi_1$ and $\Phi_2$, the output of the XOR component 510 is a "0" or low value. A data toggle register/component 516 is operative to receive the result from the XOR component 510. The data toggle component 516 is clocked on $\Phi_3$ and, therefore, outputs the data toggle value or indication on the $\Phi_3$ clock. Although not shown, a second data toggle register/component can be employed in series with the data toggle component 516 in order to add a delay or shift the data toggle value.

Figure 5D:
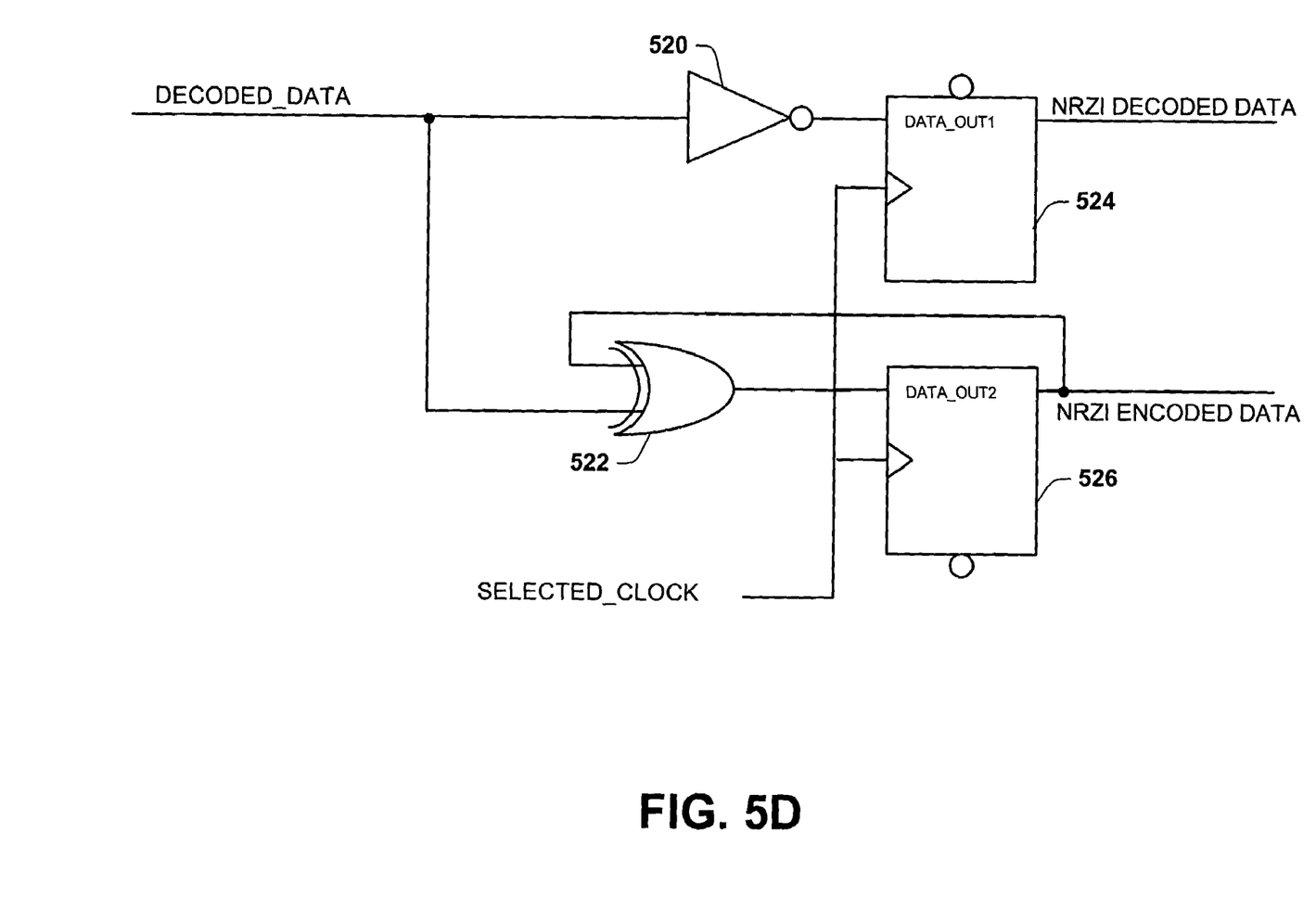
FIG. 5D is a schematic diagram illustrating another portion of the data recovery device in accordance with an aspect of the present invention.

FIG. 5D is a diagram illustrating another portion of the data recovery device 500 in accordance with an aspect of the present invention. This portion illustrates processing of the decoded data generated in FIG. 5A into NRZI decoded data and NRZI encoded data. It is appreciated that components other than those depicted and described can be employed instead. Additionally, it is appreciated that the encoding/decoding operations performed can be absent and/or varied and still be in accordance with the present invention.

An inverter 520 receives the decoded data and generates an inverse of the decoded data that is received by a first output register 524. An XOR component 522 also receives the decoded data as well as an NRZI encoded data output and provides the result to a second output register 526. The first output register 524 operates on a selected clock to generate NRZI decoded data according to the selected clock. Also, the second output register 526 operates on the selected clock to generate the NRZI encoded data according to the selected clock, which is also fed back to the XOR component 522. The selected clock operates on substantially the same frequency as the received data but triggers the first and second output registers 524 and 526 at a suitable phase.

Figure 6A:
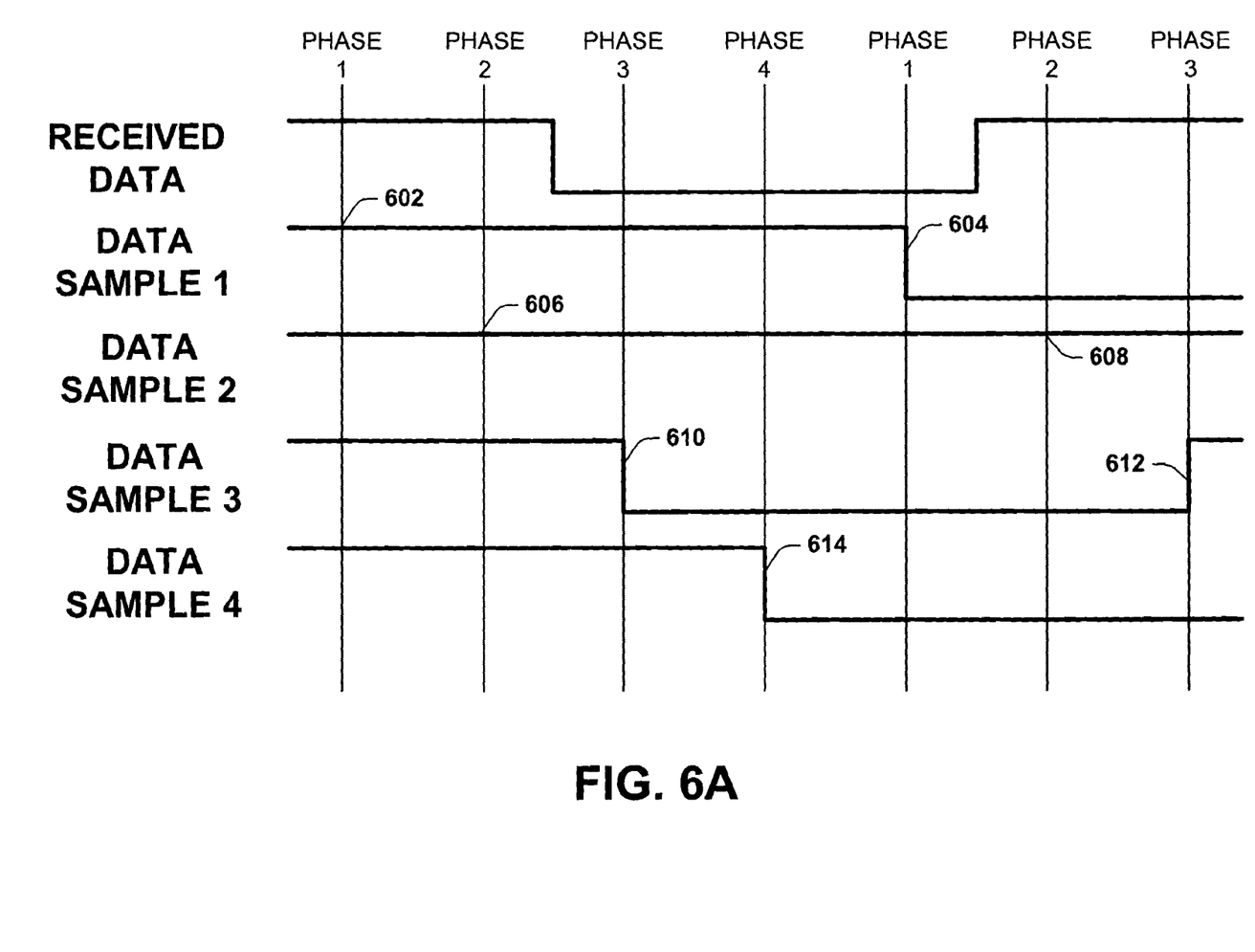
FIG. 6A is a timing diagram illustrating an operation of a data recovery device in accordance with an aspect of the present invention.
Figure 6B:
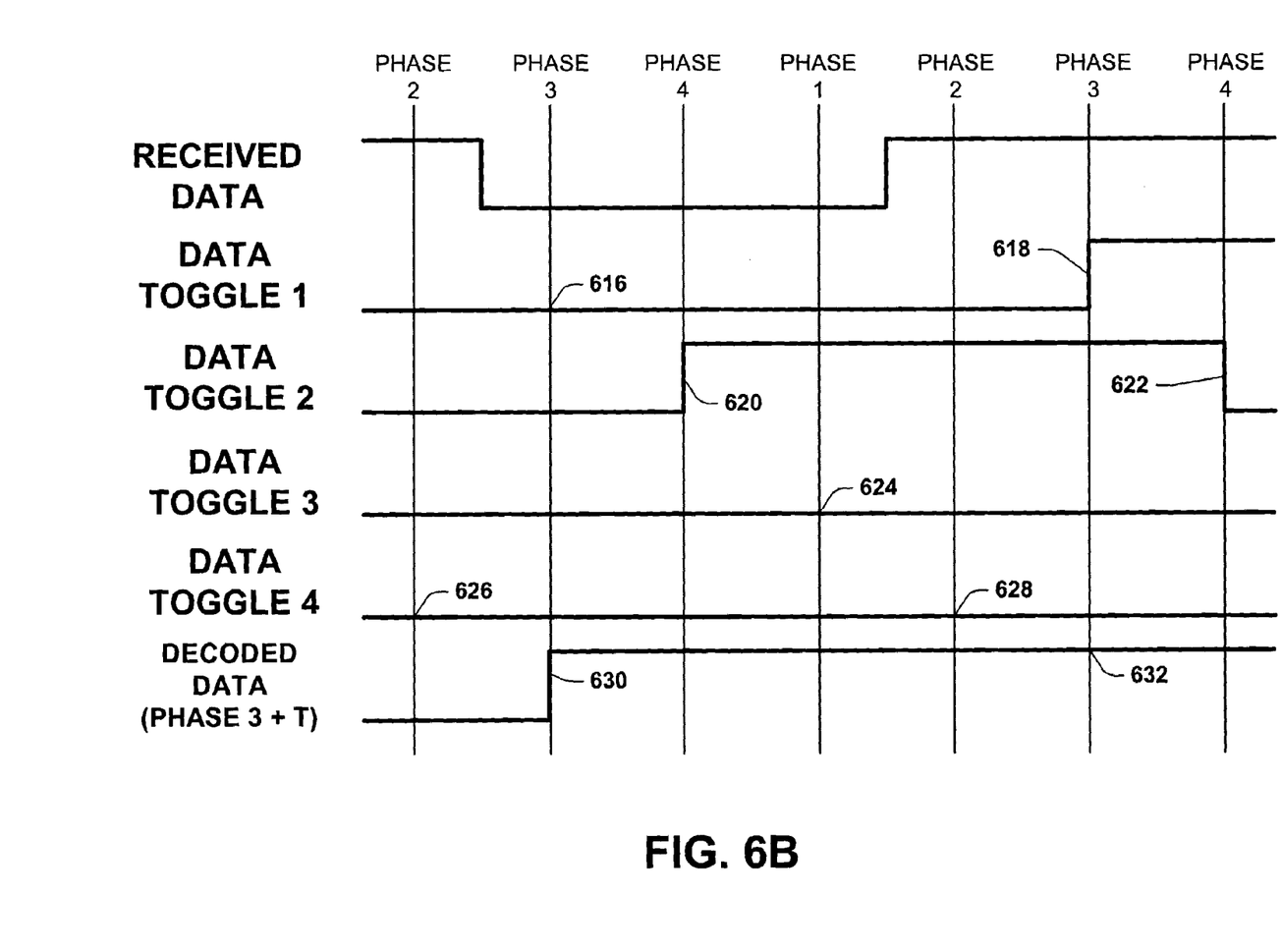
FIG. 6B is a timing diagram illustrating data toggle operation of the data recovery device in accordance with an aspect of the present invention.
Figure 6C:
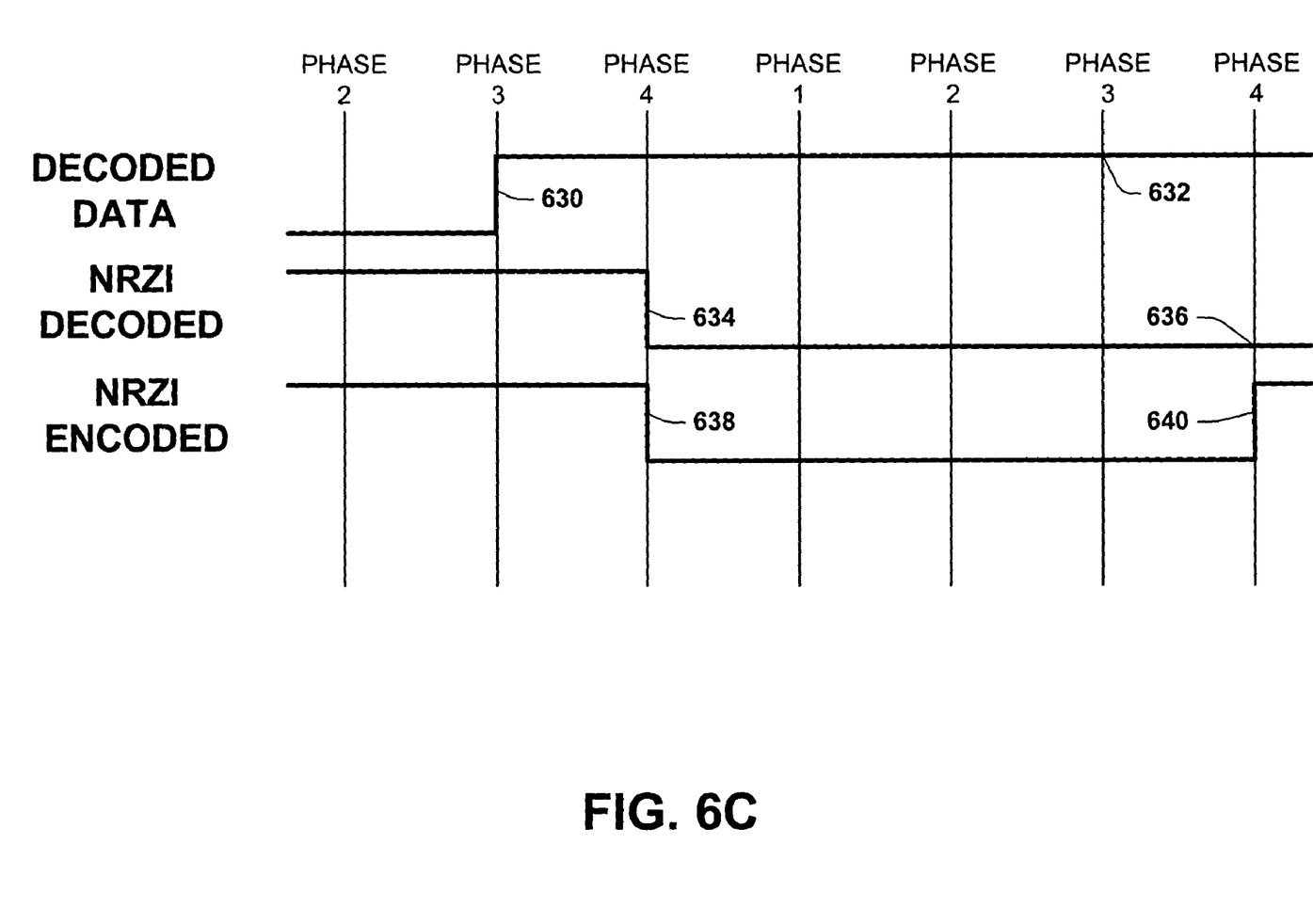
FIG. 6C is a timing diagram illustrating operation of NRZI encoding and decoding in accordance with an aspect of the present invention.

FIGS. 6A, 6B, and 6C illustrate operation of a data recovery device in accordance with an aspect of the present invention. The data recovery device can be the device 500 described with respect to FIG. 5A and/or variations thereof. The device is illustrated and described with only 4 phases and data samples in order to facilitate a fuller understanding of the present invention, however it should be appreciated that any number of samples may be employed in conjunction with the present invention.

Beginning with FIG. 6A, an exemplary timing diagram for a data recovery device in accordance with an aspect of the present invention is provided. FIG. 6A illustrates received data along with associated data samples. The received data is NRZI encoded and may contain substantial amounts of jitter and/or other components. The frequency of the received data is generally known, however its clocking phase is not. A phase generator is employed to generate four evenly spaced clocks offset by ¼ a bit time period. A suitable phase generator is described with respect to FIG. 3. Four phases or clocks are present in this example, phase 1, phase 2, phase 3, and phase 4.

A first data sample (DATA SAMPLE 1) operates on the phase 1 clock to sample the received data at that time. Because the first data sample is obtained on the phase 1 clock, it can be seen that at the first clocking 602 in the timing diagram, the data sample remains high whereas at the second clocking 604 the data sample becomes low. A second data sample (DATA SAMPLE 2) operates on the phase 2 clock to sample the received data. As a result, the second data sample remains high at a first clocking 606 and at a second clocking 608. A third data sample (DATA SAMPLE 3) operates on the phase 3 clock to sample the received data. Here, the third data sample becomes low on a first clocking 610 and turns high on a second clocking 612. A fourth data sample (DATA SAMPLE 4) operates on the phase 4 clock to sample the received data. Accordingly, the fourth data sample becomes low on a first clocking at 614. Sample registers, such as described with respect to FIG. 5A, can be employed to obtain the data samples.

FIG. 6B is an exemplary timing diagram illustrating data toggles for a data recovery device in accordance with an aspect of the present invention. FIG. 6B illustrates the received data along with associated data toggles.

A first data toggle (DATA TOGGLE 1) is clocked at phase 3 and determines whether a transition occurred between phase 1 and phase 2 by performing a logical exclusive or (XOR) of the first and second data samples. Thus, the first data toggle remains low at a first clocking 616 but becomes high at a second clocking 618. A second data toggle (DATA TOGGLE 2) is clocked at phase 4 and determines whether a transition occurred between a previous phase 2 and phase 3 by performing an XOR of the second and third data samples. As a result, the second data toggle becomes high at a first clocking 620 and becomes low at a second clocking 622. A third data toggle (DATA TOGGLE 3) is clocked at phase 3. The third data toggle determines whether a transition occurred between a previous phase 3 and phase 4 by performing an XOR of the third and fourth data samples. As a result, the third data toggle remains low at a first clocking 624. A fourth data toggle (DATA TOGGLE 4) is clocked at phase 2. The third data toggle determines whether a transition occurred between a previous phase 4 and phase 1 by performing an XOR of the previous fourth data sample and the first data sample. The fourth data toggle remains low at a first clocking 626 and a second clocking 628. Decoded data is obtained by performing an OR operation on the four data toggle values and operates at a suitable clock (e.g., phase 3 plus a single bit time so that data toggle values covering a single bit time can be analyzed). However, it is appreciated that other suitable clock(s) can be employed and still be in accordance with the present invention. This clocking allows the four data toggles to be obtained and used to determine if a transition has occurred within the bit time. As a result, the decoded data value becomes high at a clocking 630 due to the transition detected by the second data toggle at 620 and remains high at 632 due to the transition detected by first data toggle at 618.

Turning now to FIG. 6C, another exemplary timing diagram for a data recovery device in accordance with an aspect of the present invention is presented. FIG. 6C illustrates the decoded data along with NRZI decoded and NRZI encoded data. The NRZI decoded data and the NRZI encoded data are clocked a phase later, in this example, than the decoded data. The NRZI decoded data is simply an inverse of the decoded data and becomes low at a first clock 634 and remains low at a second clock 636. The NRZI encoded data is a conversion of the decoded data into NRZI format. At a first clock 638, the NRZI data becomes low and at a second clock 640, the NRZI data become high, which corresponds to a "0" value. See FIG. 5D for an exemplary circuit to obtain the NRZI decoded and the NRZI encoded data.

Figure 7:
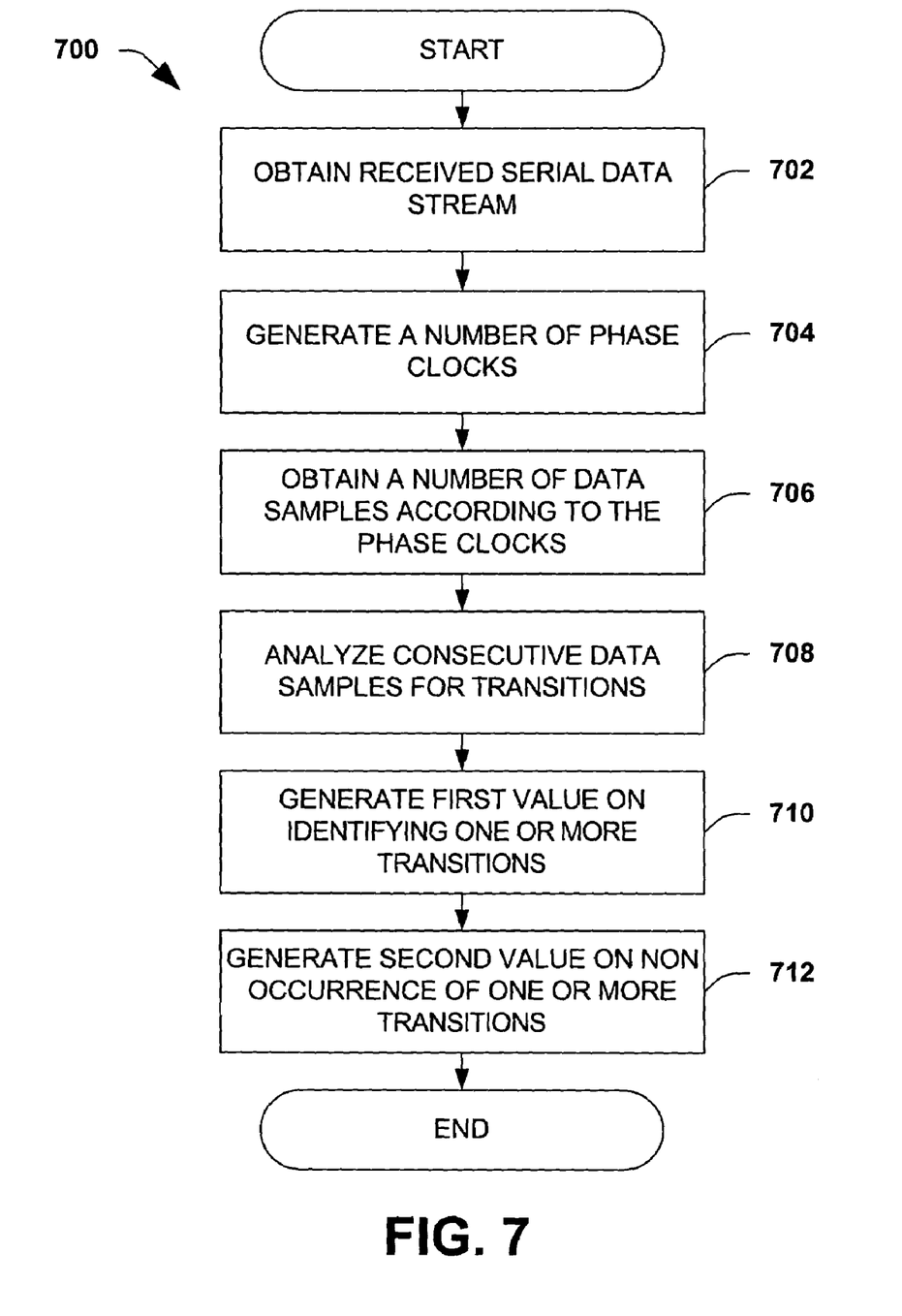
FIG. 7 is a flow diagram illustrating a method of recovering data from a received signal in accordance with an aspect of the present invention.

In view of the foregoing structural and functional features described supra, methodologies in accordance with various aspects of the present invention will be better appreciated with reference to FIGS. 3–6C. While, for purposes of simplicity of explanation, the methodology of FIG. 7 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIG. 7 is a flow diagram illustrating a method 700 of recovering data in accordance with an aspect of the present invention. The method recovers data from a received data stream without selecting or utilizing a clock and/or data phase.

The method 700 begins at block 702 where a received serial data stream is obtained. The received data stream has a known frequency but its phase is not known. The received data stream may have jitter and/or other unwanted signal components. A number of phase clocks are generated at block 704 according to the standard frequency. The phase clocks are equally spaced throughout a single time period or bit time. A number of data samples are obtained according to the number of phase clocks at block 706. Thus, a data sample is obtained at each phase. The number of data samples and phase clocks generated depend on a number of factors including, but not limited to, jitter, data rate, and the like.

Consecutive data samples are analyzed to identify transitions or data toggles at block 708. The consecutive samples are analyzed within a clock cycle. Generally, a transition from low-to-high or from high-to-low is sought to indicate a transition. An occurrence of one or more transitions/data toggles over a bit time causes a first value to be generated at block 710. A non-occurrence of one or more transitions/data toggles over a bit time causes a second value, opposite that of the first value, to be generated at block 712 (e.g., first value is "1" whereas the second is "0" or the first value is "0" where the second value is "1"). Generally, an XOR operation on consecutive data samples and an OR operation on the results of the XOR operation yield a serial decoded data stream. However, other suitable mechanisms can be employed to recover the data. The method 700 returns to block 702 for recovering data from a next bit time.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A data recovery device comprising:
a number of sample components that obtain samples of data in a received encoded serial data stream at a number of phases, said received encoded serial data stream being a series of bits having a bit time period, indicating a data value by either a transition between two data levels or no transition during the bit time period, wherein the number of phases are successively offset throughout the bit time period and the data samples are obtained throughout the bit time period at the number of phases;

a number of transition detectors that analyze consecutive data samples in order to identify transitions by comparing pairs of successive data samples and generating a transition signal during a bit time period at a predetermined logic level when a successive pair of data samples have different data levels; and a combining circuit that generates a serial decoded data stream by combining the transition signals.

2. The device of claim 1, wherein the number of sample components are arranged in a dual column configuration to mitigate metastability.

3. The device of claim 1, wherein the sample components are comprised of D-type flip flops respectively clocked at one of the number of phases.

4. The device of claim 1, wherein the number of obtained samples is 12.

5. The device of claim 1, wherein the transition detectors comprise an XOR logic that generates a low value on a non-occurrence of a transition between two associated successive samples and generates a high value on an occurrence of a transition between two associated successive samples and a register that maintains the generated value.

6. The device of claim 1, wherein the transition detectors generate data toggles that indicate occurrence or non-occurrence of a transition for respective time periods.

7. The device of claim 6, wherein the combining circuit performs a logical OR operation on the data toggles to generate the decoded data value.

8. The device of claim 7, wherein the combining circuit substantially comprises one or more OR gates.

9. The device of claim 1, further comprising a NRZI decoder that decodes the decoded data into non-encoded data.

10. The device of claim 9, wherein the NRZI decoder decodes the decoded data with an inverter.

11. The device of claim 1, further comprising an NRZI encoder that encodes the decoded data stream into an NRZI encoded data stream.

12. A clock and data recovery system comprising:
a receiver that receives an encoded serial data stream having an associated frequency and said received serial data stream being a series of bits having a bit time period, indicating a data value by either a transition between two data levels or no transition during the bit time period;

a phase generator that produces N phases of a clock signal that have an associated frequency of about the frequency of the received serial data stream, wherein the N phases are successively offset by (1/N) of a time period;

a sample component that obtains data samples of the received serial data stream at the N phases; and a data recovery component that identifies transitions in the received serial data stream by comparing pairs of successive data samples and obtains a recovered serial data stream based solely on the identified transitions.

13. The system of claim 12, further comprising a clock recovery component that recovers one or more clocks associated with the received serial data stream.

14. The system of claim 13, wherein the clock recovery component is operable to identify a sample phase and a clock phase per bit of data.

15. The system of claim 12, wherein the N phases are substantially evenly spaced.

16. The system of claim 12, wherein N is equal to 8 and the time period is equal to about 2.08333 ns.

17. A method of recovering data from a received encoded serial data stream, said received encoded serial data stream being a series of bits having a bit time period, indicating a data value by either a transition between two data levels or no transition during the bit time period comprising:
  obtaining a number of data samples of the received encoded serial data stream at each of a number of phase clocks, the phase clocks being at the frequency of the received encoded serial data stream and successively offset throughout the bit time period;
  analyzing consecutive data samples to identify transitions by comparing pairs of successive data samples;
  generating a first value on identifying one or more transitions; and
  generating a second value that is a complement of the first value on not identifying one or more transitions.

18. The method of claim 17, wherein the first value is high and the second value is low.

19. The method of claim 17, wherein analyzing consecutive samples comprises performing an exclusive-or operation on the consecutive samples.

20. A data recovery device comprising:
  a number of sample components that obtain samples of a received serial data stream at a number of phases, wherein the number of phases are successively offset throughout a bit time period and the samples are obtained throughout the time period at the number of phases;
  a number of transition detectors corresponding to the number of obtained samples that analyze consecutive data samples in order to identify transitions;
  a first circuit that generates a serial decoded data stream that comprises values for time period(s) according to occurrence or non occurrence of one or more transitions within the respective time period(s); and
  a NRZI decoder that decodes the decoded data into non-encoded data.

21. The device of claim 20, wherein the NRZI decoder decodes the decoded data with an inverter.

22. A data recovery device comprising:
  a number of sample components that obtain samples of a received serial data stream at a number of phases, wherein the number of phases are successively offset throughtout a bit time period and the samples are obtained throughout the time period at the number of phases;
  a number of transition detectors corresponding to the number of obtained samples that analyze consecutive data samples in order to identify transitions;
  a first circuit that generates a serial decoded data stream that comprises values for time period(s) according to occurrence or non occurrence of one or more transitions within the respective time period(s); and
  an NRZI encoder that encodes the decoded data stream into an NRZI encoded data stream.

23. A clock and data recovery system comprising:
  a receiver that receives a serial data stream having an associated frequency;
  a phase generator that produces N phases of a clock signal that have an associated frequency of about the frequency of the received serial data stream, wherein the N phases are successively offset by (1/N) of a time period;
  a data recovery component that identifies transitions in the received serial data stream and obtains a recovered serial data stream based solely on the identified transitions; and
  a clock recovery component that recovers one or more clocks associated with the received serial data stream, wherein the clock recovery component is operable to identify a sample phase and a clock phase per bit of data.

24. A clock and data recovery system comprising:
  a receiver that receives a serial data stream having an associated frequency;
  a phase generator that produces N phases of a clock signal that have an associated frequency of about the frequency of the received serial data stream, wherein the N phases are successively offset by (1/N) of a time period; and
  a data recovery component that identifies transitions in the received serial data stream and obtains a recovered serial data stream based solely on the identified transitions,
  wherein the N phases are substantially evenly spaced.

25. A clock and data recovery system comprising:
  a receiver that receives a serial data stream having an associated frequency;
  a phase generator that produces N phases of a clock signal that have an associated frequency of about the frequency of the received serial data stream, wherein the N phases are successively offset by (1/N) of a time period; and
  a data recovery component that identifies transitions in the received serial data stream and obtains a recovered serial data stream based solely on the identified transitions,
  wherein N is equal to 8 and the time period is equal to about 2.08333 ns.

26. A method of recovering data over a single time period comprising:
  obtaining a number of data samples of a received serial data stream according to a number of phase clocks;
  analyzing consecutive data samples to identify transitions;
  generating a first value on identifying one or more transitions; and
  generating a second value that is a complement of the first value on not identifying one or more transitions,
  wherein the phase clocks are successively offset so as to provide evenly spaces phases throughout a time period.

* * * * *